(12) United States Patent
Jenq

(10) Patent No.: US 6,316,344 B1
(45) Date of Patent: Nov. 13, 2001

(54) METHOD FOR FORMING GATE

(75) Inventor: Jason J. S. Jenq, Pingtung (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/348,371

(22) Filed: Jul. 7, 1999

(51) Int. Cl.[7] ............... H01L 21/3205; H01L 21/4763
(52) U.S. Cl. ............................. 438/592; 438/593
(58) Field of Search ................................ 438/744, 593, 438/238, 592, 241, 239, 595, 421

(56) References Cited

U.S. PATENT DOCUMENTS

| | | | |
|---|---|---|---|
| 5,482,749 | * | 1/1996 | Telford et al. ............. 427/578 |
| 5,483,104 | * | 1/1996 | Godinho et al. ............ 257/758 |
| 5,756,392 | * | 5/1998 | Lu et al. .................... 438/592 |
| 5,817,562 | * | 10/1998 | Chang et al. ............... 438/305 |
| 5,851,927 | * | 12/1998 | Cox et al. .................. 438/744 |
| 5,920,744 | * | 7/1999 | Wu ............................ 438/224 |
| 6,033,978 | * | 3/2000 | Fujii et al. ................. 438/621 |
| 6,074,908 | * | 6/2000 | Huang ....................... 438/241 |

* cited by examiner

Primary Examiner—John F. Niebling
Assistant Examiner—Walter L. Lindsay, Jr.
(74) Attorney, Agent, or Firm—Thomas, Kayden, Horstemeyer & Risley

(57) ABSTRACT

A method for forming a gate. A gate oxide layer is formed on a substrate having an isolation structure, and a polysilicon layer is formed on the gate oxide layer. A tungsten silicide layer is formed by low pressure chemical vapor deposition with dichlorosilane and tungsten hexafluoride as a gas source on the polysilicon layer. The polysilicon layer and the tungsten silicide layer constitute a polycide layer. A first rapid thermal annealing process is performed in an ammonia atmosphere to form a first protective layer on the tungsten silicide layer. A nitride layer is formed by low pressure chemical vapor deposition on the first protective layer, and then a gate structure is defined. The gate oxide layer, the polysilicon layer, the tungsten silicide layer, the first protective layer and the nitride layer together constitute the gate structure. A second rapid thermal annealing process is performed in an ammonia atmosphere to form a second protective layer on sidewalls of the gate oxide layer, the polysilicon layer and the tungsten silicide layer. A spacer is formed and abuts the sidewalls of the first and second protective layers, and the nitride layer.

6 Claims, 3 Drawing Sheets

METHOD FOR FORMING GATE

BACKGROUND OF THE INVENTION

1. Field of Invention

The present invention relates to a method for forming a gate. More particularly, the present invention relates to a method for forming a protective layer to protect a gate during a rapid thermal annealing process.

2. Description of Related Art

Tungsten silicide ($WSi_x$) is commonly used as a gate conductor in integrated circuits, especially for memory chips, due to its high thermal stability, low resistivity, low contamination levels and good step coverage. The tungsten silicide layer, which is usually formed by low pressure chemical vapor deposition (LPCVD) with dichlorosilane ($SiH_2Cl_2$) and tungsten hexafluoride ($WF_6$) as a gas source, has many advantages—lower fluorine content, improved step coverage, lower post-annealed stress and better adhesion with other materials. Therefore, nowadays, the tungsten silicide layer is formed in the manner described above in some semiconductor processes.

In the process of forming a gate structure, a nitride layer serving as a cap layer of the gate structure is usually formed on a tungsten silicide layer after a doped polysilicon layer and a tungsten silicide layer are formed on a substrate in sequence. The nitride layer is formed by low pressure chemical vapor deposition at about 700–800° C. The LPCVD chamber is a vertical furnace without a load lock, so oxygen contamination can occur during wafer loading.

Since the tungsten silicide layer is in an oxidizing atmosphere at a high temperature, silicon dioxide ($SiO_2$) is formed during the process of forming the nitride layer as long as the silicon content of the tungsten silicide layer is adequate. However, if the silicon content of the tungsten silicide layer is limited, an abnormal $WSi_x$ oxidation effect occurs. Due to the abnormal $WSi_x$ oxidation effect, $WSi_x$ is decomposed; thus, $SiO_2$, elemental W, $WO_2$, $WO_3$, and other volatile tungsten oxides are formed. Both $WO_2$ and $WO_3$ are volatile (the sublimation point for $WO_2$ is 800° C.) so that a cracking effect and a blistering effect occur in the tungsten silicide layer.

After the gate structure is defined, a rapid thermal annealing process is performed. The rapid thermal annealing process is usually performed in an oxygen atmosphere and a temperature of the rapid thermal annealing process is raised to about 1000° C., quickly. The rapid thermal annealing process oxidizes sidewalls of the gate structure to form an isolation structure which prevents the gate structure from coupling with a contact or other devices. Oxide protrusions are also easily formed on the sidewalls of the tungsten silicide layer during the rapid thermal annealing process. Therefore, some regions of a subsequently formed spacer are thin or the oxide protrusions protrude from the spacer. In a subsequent process of forming a bit line contact hole, a portion of the gate structure under the thin region of the spacer may be exposed during the etching process. As a result, wordline-to-bitline leakage occurs because the gate structure couples with a plug within the bit line contact hole. If these oxide protrusions protrude from the spacer and block the bit line contact hole, the conductive material does not easily fill the bit line contact hole. So, an open bitline contact problem generates.

Another function of the rapid thermal annealing process is to change the crystal structure and grain size of $WSi_x$, so that sheet resistance of the tungsten silicide layer can be reduced. For example, the crystal structure of $WSi_x$ is transformed into a tetragonal structure by performing the rapid thermal annealing process at 700° C.; the sheet resistance of the tungsten silicide layer is decreased from 30 to 3 ohm/sq. after the rapid thermal annealing process. In addition, the grain size of $WSi_x$ is less than 100 nm. However, an agglomeration effect of the tungsten silicide layer easily occurs during the rapid thermal annealing process, and hence causes a narrow linewidth effect on the gate structure. Because of the agglomeration effect of the tungsten silicide layer, the surface of the tungsten silicide layer becomes rough, and the sheet resistance of the tungsten silicide layer is increased.

SUMMARY OF THE INVENTION

The invention provides a method for forming a gate. In the method, two protective layers are respectively formed by performing two rapid thermal annealing processes, and the tungsten silicide layer is surrounded by the protective layers. So, degradation mechanisms, the abnormal $WSi_x$ oxidation effect, the cracking effect, the blistering effect and wordline-to-bitline leakage, are avoided.

The invention provides a method for forming a gate. A gate oxide layer is formed on a substrate having an isolation structure, and a polysilicon layer is formed on the gate oxide layer. A tungsten silicide layer is formed by low pressure chemical vapor deposition with dichlorosilane and tungsten hexafluoride as a gas source on the polysilicon layer. The polysilicon layer and the tungsten silicide layer constitute a polycide layer. A first rapid thermal annealing process is performed in an ammonia atmosphere to form a first protective layer on the tungsten silicide layer. A nitride layer is formed by low pressure chemical vapor deposition on the first protective layer, and then a gate structure is defined. The gate structure comprises the gate oxide layer, the polysilicon layer, the tungsten silicide layer, the first protective layer and the nitride layer. A second rapid thermal annealing process is performed in an ammonia atmosphere to form a second protective layer on sidewalls of the gate oxide layer, the polysilicon layer and the tungsten silicide layer. A spacer is formed and abuts the sidewalls of the first and second protective layers, and the nitride layer.

In the invention, two rapid thermal annealing processes are respectively performed in an ammonia atmosphere, and respectively form protective layers; thus, the tungsten silicide layer is surrounded by protective layers. Because of the protective layer on the tungsten silicide layer, the abnormal $WSi_x$ oxidation effect that usually occur during the process of forming the nitride layer is avoided, therefore the cracking effect and the blistering effect are also avoided. Wordline-to-bitline leakage and the open bitline contact problem are avoided due to the other protective layer on the sidewalls of the tungsten silicide layer. Furthermore, the rapid thermal annealing processes are performed in an ammonia atmosphere, so the agglomeration effect does not occur. As a result, the sheet resistance of the tungsten silicide layer is reduced and the surface of the tungsten silicide layer is planar. Additionally, the protective layers protect the tungsten silicide layer from chemical attack during cleaning processes. Moreover, the protective layers avoid loss of dopants from the polycide layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
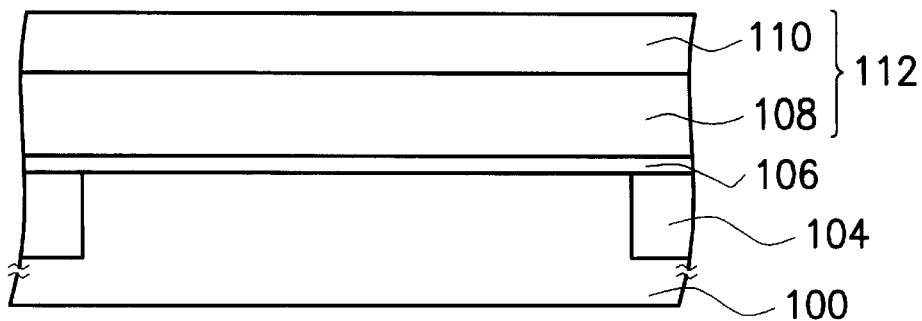
FIGS. 1A through 1E are schematic, cross-sectional views showing the progression of manufacturing steps for a gate according to one preferred embodiment of this invention.

Referring to FIG. 1A, a substrate 100 having an isolation structure 104 is provided, wherein the isolation structure 104 is a shallow trench isolation (STI), for example. In order to set the desired threshold voltage for the substrate 100, impurities are implanted into the substrate 100. A gate oxide layer 106 is formed on the substrate 100. A polysilicon layer 108, which is preferably doped, is formed on the gate oxide layer 106; a tungsten silicide layer 110 is formed on the polysilicon layer 108. The polysilicon layer 108 and the tungsten silicide layer 110 constitute a polycide layer 112. The polysilicon layer 108 is preferably formed by chemical vapor deposition; the thickness of the polysilicon layer 108 is about 500–1000 Å. Preferably, a low pressure chemical vapor deposition process is performed to form the tungsten silicide layer 110 by using a gas source includes dichlorosilane ($SiH_2Cl_2$) and tungsten hexafluoride ($WF_6$).

Figure 1B:
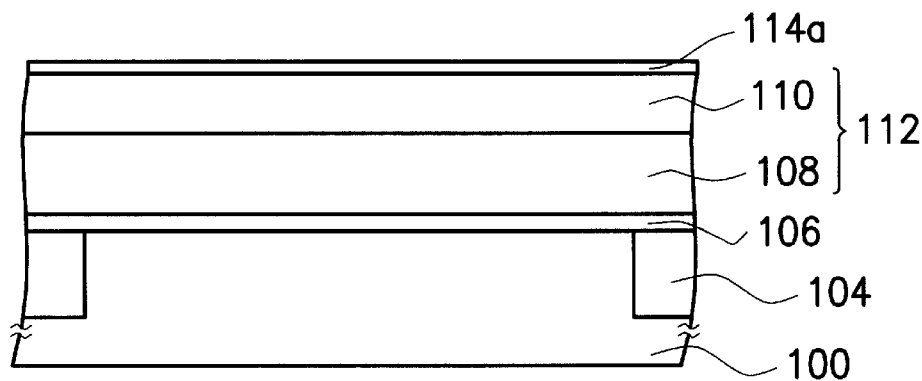

Referring to FIG. 1B, a rapid thermal annealing process is performed in an ammonia ($NH_3$) atmosphere to form a protective layer 114a on the tungsten silicide layer 110. The preferably rapid thermal annealing process is described as having the following steps. First, a first annealing process is performed at a temperature of about 750–850° C. for a duration of about 25–35 seconds, and then a second annealing process is performed at a temperature of about 950–1050° C. for a duration of about 5–15 seconds. The protective layer 114a is made from a material such as nitride.

Figure 1C:
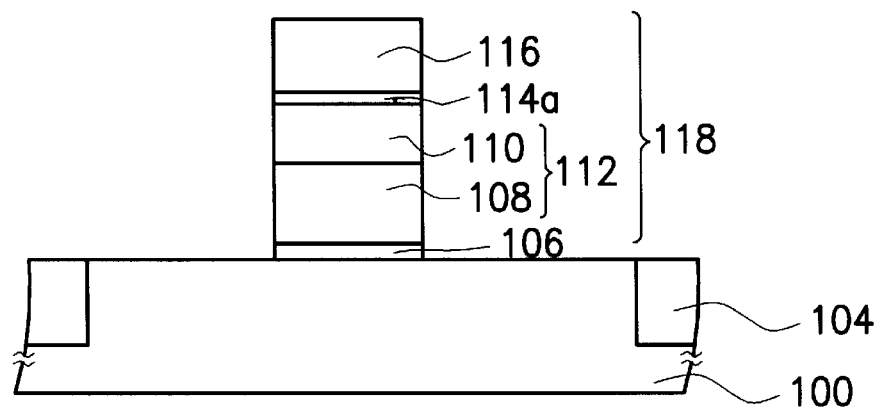

Referring to FIG. 1C, a nitride layer 116 is formed on the protective layer 114a, and then a gate structure 118 is defined by photolithography and etching. The gate structure 118 comprises the gate oxide layer 106, the polysilicon layer 108, the tungsten silicide layer 110, the protective layer 114a and the nitride layer 116. The nitride layer 116 is formed, for example, by low pressure chemical vapor deposition; the thickness of the nitride layer 116 is about 1400–1600 Å.

Although the process of forming the nitride layer 116 should be performed at a high temperature, the quality of the tungsten silicide layer 110 is still ensured because of the protective layer 114a on the tungsten silicide layer 110. The abnormal $WSi_x$ oxidation effect is avoided, so that the cracking effect and the blistering effect are also avoided.

Figure 1D:
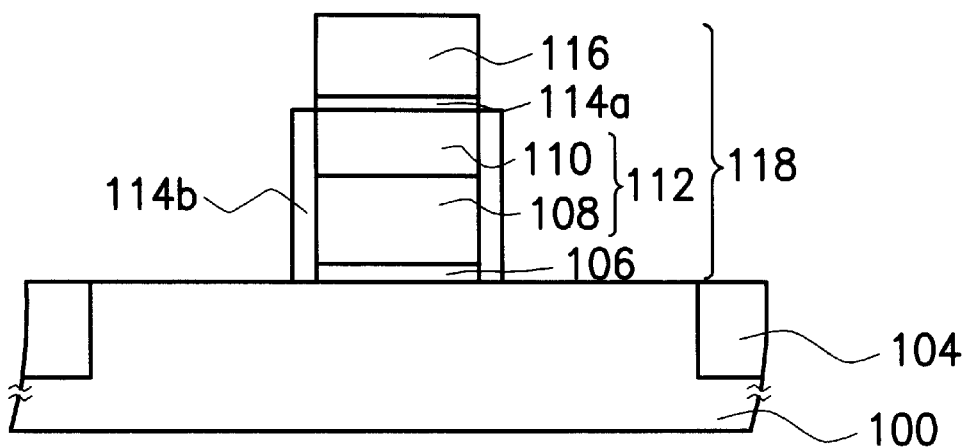

Referring to FIG. 1D, another rapid thermal annealing process is performed in an ammonia atmosphere to form a protective layer 114b such as nitride on sidewalls of the gate oxide layer 106, the polysilicon layer 108 and the tungsten silicide layer 110. For example, the rapid thermal annealing process including two steps is described as follows. First, an annealing process is performed at a temperature about 750–850° C. for a duration of about 25–35 seconds, and then another annealing process is performed at a temperature about 950–1050° C. for a duration of about 5–15 seconds.

Figure 1E:
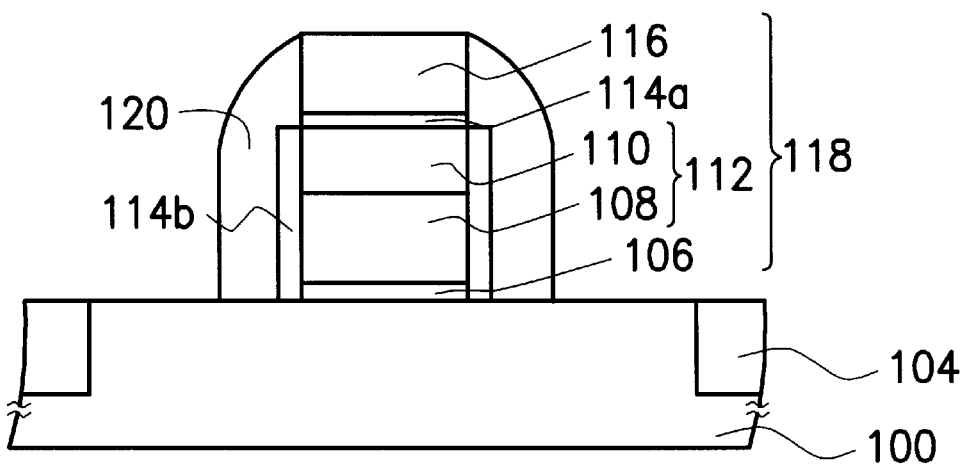

Referring to FIG. 1E, a spacer 120 is formed and abuts the sidewalls of the protective layers 114a, 114b and the nitride layer 116. The formation of the spacer 120 is described as follows. A conformal oxide layer (not shown in FIG. 1E) is formed, for example, by low pressure chemical vapor deposition. An etch-back process is performed to remove a portion of the oxide layer; thus the spacer 120 is formed on the sidewalls of the protective layers 114a, 114b and the nitride layer 116.

Since the tungsten silicide layer 110 is surrounded by the protective layers 114a, 114b, oxide protrusions are not formed on the sidewalls of the tungsten silicide layer 110; thus, the thickness of the spacer 120 is uniform. As a result, wordline-to-bitline leakage and the open bitline contact problem are avoided. Additionally, the rapid thermal annealing process is performed in an ammonia atmosphere. Therefore, the agglomeration effect does not occur; i.e. the sheet resistance of the tungsten silicide layer 110 can be reduced and the surface of the tungsten silicide layer 110 can be planar.

In the invention, two rapid thermal annealing processes are respectively performed in an ammonia atmosphere, and the first and the second protective layers are formed respectively; thus, the tungsten silicide layer are surrounded by the protective layers. Because of the protective layer on the tungsten silicide layer, the abnormal $WSi_x$ oxidation effect that usually occurs during the process of forming the nitride layer is avoided, therefore the cracking effect and the blistering effect are also avoided. Wordline-to-bitline leakage and the open bitline contact problem are avoided due to the second protective layer on the sidewalls of the tungsten silicide layer. Furthermore, the rapid thermal annealing processes are performed in an ammonia atmosphere, so the agglomeration effect does not occur. As a result, the sheet resistance of the tungsten silicide layer is reduced and the surface of the tungsten silicide layer is planar. Additionally, the protective layers protect the tungsten silicide layer from chemical attack during cleaning processes. Moreover, the protective layers avoid loss of dopants from the polycide layer.

On the other hand, two rapid thermal annealing processes in the invention help to change the grain size of $WSi_x$, so that the sheet resistance of the tungsten silicide layer is reduced.

Figure 2:
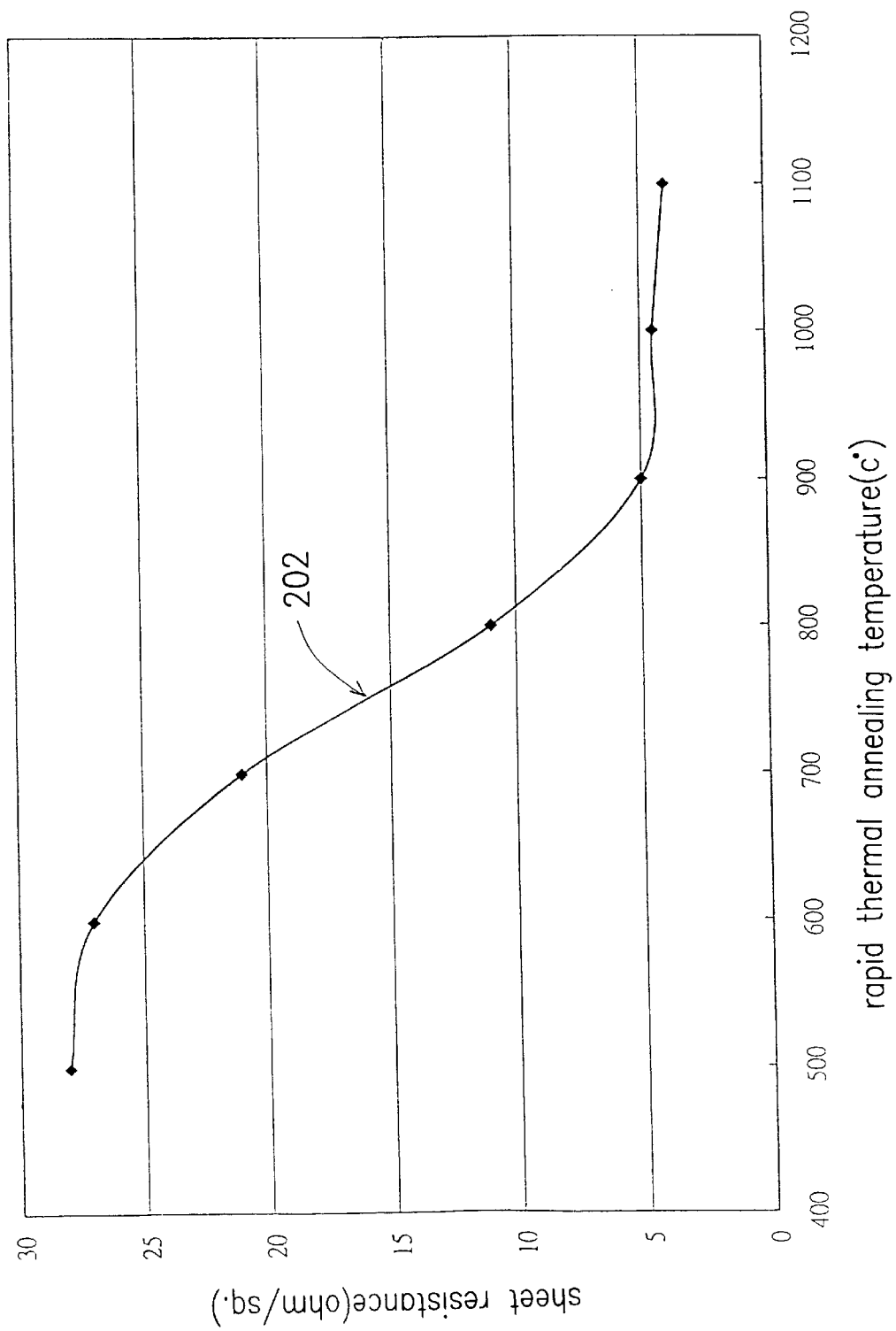
FIG. 2 shows a curve of sheet resistance of a tungsten silicide layer vs. rapid thermal annealing temperature.

FIG. 2 shows a curve of sheet resistance of a tungsten silicide layer vs. rapid thermal annealing temperature.

Referring to FIG. 2, curve 202 represents the sheet resistance of the tungsten silicide layer as a function of a rapid thermal annealing temperature in this invention. As shown in FIG. 2, the sheet resistance of the tungsten silicide layer is greatly decreased after performing the rapid thermal annealing process at above 700° C.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a gate, comprising the step of:
   providing a substrate;
   forming a gate oxide layer on the substrate;
   forming a polysilicon layer on the gate oxide layer;
   forming a tungsten silicide layer on the polysilicon layer;
   performing a first rapid thermal annealing process in an ammonia atmosphere to form a first protective layer on the tungsten silicide layer;
   forming a nitride layer on the first protective layer;

defining a gate structure, wherein the gate structure includes the gate oxide layer, the polysilicon layer, the tungsten silicide layer the first protective layer, and the nitride layer;

performing a second rapid thermal annealing process in an ammonia atmosphere to form a second protective layer on the sidewalls of the polysilicon layer and the tungsten silicide layer;

forming a spacer to abut against sidewalls of the nitride layer, the first and the second protective layers, wherein the first rapid thermal annealing process further comprises:

performing a first annealing process for about 25–35 seconds at a temperature of about 750–850° C.; and performing a second annealing process for about 5–15 seconds at a temperature of about 950–1050° C.

2. A method for forming a gate, comprising the step of:

providing a substrate;

forming a gate oxide layer on the substrate;

forming a polysilicon layer on the gate oxide layer;

forming a tungsten silicide layer on the polysilicon layer;

performing a first rapid thermal annealing process in an ammonia atmosphere to form a first protective layer on the tungsten silicide layer;

forming a nitride layer on the first protective layer;

defining a gate structure, wherein the gate structure includes the gate oxide layer, the polysilicon layer, the tungsten silicide layer the first protective layer, and the nitride layer;

performing a second rapid thermal annealing process in an ammonia atmosphere to form a second protective layer on the sidewalls of the polysilicon layer and the tungsten silicide layer;

forming a spacer to abut against sidewalls of the nitride layer, the first and the second protective layers, wherein the second rapid thermal annealing process further comprises:

performing a first annealing process for about 25–35 seconds at a temperature of about 750–850° C.; and performing a second annealing process for about 5–15 seconds at a temperature of about 950–1050° C.

3. A method for maintaining quality of a tungsten silicide layer, which is suitable for a semiconductor process, comprising the steps of:

providing a substrate;

forming a tungsten silicide layer on the substrate;

performing a first rapid thermal annealing process in an ammonia atmosphere to form a first protective layer on the tungsten silicide layer;

defining the tungsten silicide layer and the first protective layer to expose sidewalls of the tungsten silicide layer; and performing a second rapid thermal annealing process in an ammonia atmosphere to form a second protective layer on the sidewalls of the tungsten suicide layer, wherein the first rapid thermal annealing process further comprises:

performing a first annealing process for about 25–35 seconds at a temperature of about 750–850° C.; and performing a second annealing process for about 5–15 seconds at a temperature of about 950–1050° C.

4. A method for maintaining quality of a tungsten silicide layer, which is suitable for a semiconductor process, comprising the steps of:

providing a substrate;

forming a tungsten silicide layer on the substrate;

performing a first rapid thermal annealing process in an ammonia atmosphere to form a first protective layer on the tungsten silicide layer;

defining the tungsten silicide layer and the first protective layer to expose sidewalls of the tungsten silicide layer; and performing a second rapid thermal annealing process in an ammonia atmosphere to form a second protective layer on the sidewalls of the tungsten silicide layer, wherein the second rapid thermal annealing process further comprises:

performing a first annealing process for about 25–35 seconds at a temperature of about 750–850° C.; and performing a second annealing process for about 5–15 seconds at a temperature of about 950–1050° C.

5. A method for forming a gate, comprising the steps of:

providing a substrate;

forming a gate oxide layer on the substrate;

forming a polysilicon layer on the gate oxide layer;

forming a tungsten silicide layer on the polysilicon layer;

performing a first annealing process for about 25–35 seconds at a temperature of about 750–850° C., and then performing a second annealing process for about 5–15 seconds at a temperature of about 950–1050° C. to form a first protective layer on the tungsten silicide layer;

forming a nitride layer on the first protective layer;

defining a gate structure, wherein the gate structure includes the gate oxide layer, the polysilicon layer, the tungsten silicide layer, the first protective layer and the nitride layer;

performing a third annealing process for about 25–35 seconds at a temperature of about 750–850° C., and then performing a fourth annealing process for about 5–15 seconds at a temperature of about 950–1050° C. to form a second protective layer on sidewalls of the polysilicon layer and the tungsten silicide layer; and forming a spacer to abut against sidewalls of the nitride layer, the first and the second protective layers.

6. A method for maintaining quality of a tungsten silicide layer, which is suitable for a semiconductor process, comprising the steps of:

providing a substrate;

forming a tungsten silicide layer on the substrate;

performing a first annealing process for about 25–35 seconds at a temperature of about 750–850° C. and then performing a second annealing process for about 5–15 seconds at a temperature of about 950–1050° C. to form a first protective layer on the tungsten silicide layer;

defining the tungsten silicide layer and the first protective layer to expose sidewalls of the tungsten silicide layer; and performing a third annealing process for about 25–35 seconds at a temperature of about 750–850° C., and then performing a fourth annealing process for about 5–15 seconds at a temperature of about 950–1050° C. to form a second protective layer on the sidewalls of the tungsten silicide layer.

* * * * *